United States Patent [19]

Hayes

[11] 4,103,415

[45] Aug. 1, 1978

[54] INSULATED-GATE FIELD-EFFECT TRANSISTOR WITH SELF-ALIGNED CONTACT HOLE TO SOURCE OR DRAIN

[75] Inventor: James A. Hayes, Mountain View, Calif.

[73] Assignee: Fairchild Camera and Instrument Corporation, Mountain View, Calif.

[21] Appl. No.: 748,977

[22] Filed: Dec. 9, 1976

[51] Int. Cl.² .............................................. B01J 17/00
[52] U.S. Cl. ........................................ 29/571; 29/578; 29/589
[58] Field of Search .................... 29/571, 578, 589; 357/59

[56] References Cited

U.S. PATENT DOCUMENTS

| 3,724,065 | 4/1973 | Cabajal | 29/571 |
| 3,913,211 | 10/1975 | Seeds | 29/578 |
| 3,958,323 | 5/1976 | Moneda | 29/571 |

*Primary Examiner*—W. Tupman
*Attorney, Agent, or Firm*—Alan H. MacPherson; Henry K. Woodward

[57] ABSTRACT

An oxide dielectric layer is interposed between the polysilicon gate and the contact hole to the source or drain of an insulated-gate field-effect transistor to prevent electrical shorts between the gate and metal contact to the source or drain. The oxide dielectric layer enables the contact hole to be extremely close to the polysilicon gate without electrical shorts occurring therebetween, thereby eliminating the need for a minimum separation between the gate and contact hole.

6 Claims, 30 Drawing Figures

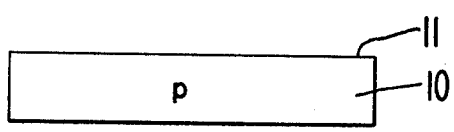
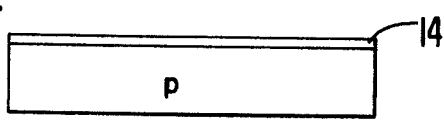
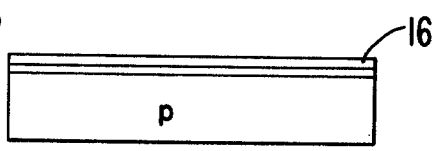
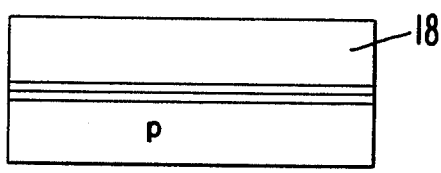
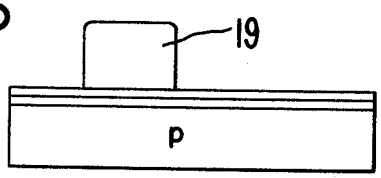
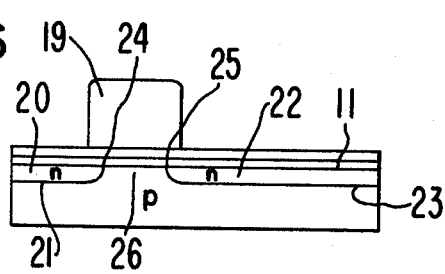
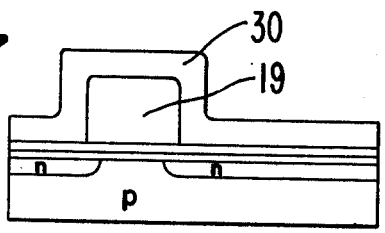
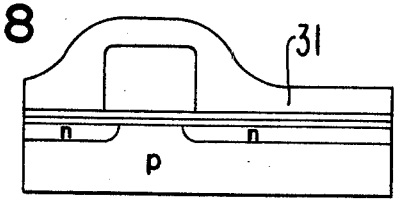
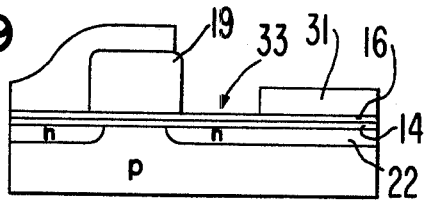
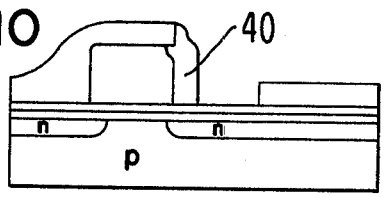
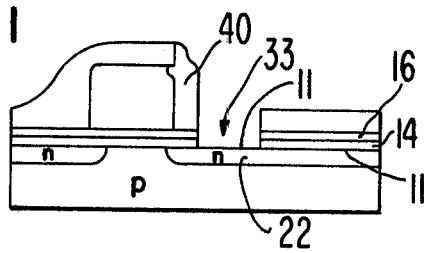
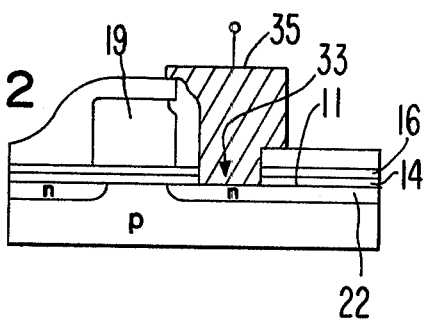

INSULATED-GATE FIELD-EFFECT TRANSISTOR WITH SELF-ALIGNED CONTACT HOLE TO SOURCE OR DRAIN

BACKGROUND OF THE INVENTION

1. Field of the Invention

This invention relates to a structure for and method for fabrication of insulated-gate field-effect (IGFET) semiconductor devices using polysilicon gates. In particular, this invention relates to a structure and method for providing a self-aligned contact hole through overlying passivation layers to an active source or drain region in an IGFET device that substantially reduces the spacing between the gate and source and drain contact holes.

2. Description of the Prior Art

An insulated-gate field-effect semiconductor device, hereinafter sometimes referred to as an IGFET device, comprises a substrate of semiconductor material of one conductivity type having a principal surface. Spaced regions of opposite conductivity type, referred to as the source and the drain, are located in the substrate and form PN junctions with the substrate, each junction extending to have an edge at the principal surface. A layer of passivation material overlies the principal surface to protect the surface edge of the PN junctions from contamination. Located over a portion of the passivation layer between the underlying source and drain is a strip of conductive material, referred to as the gate. Voltage potentials applied to the gate control the electrical field in the space between the source and drain, referred to as the channel, and consequently, the flow of electrons or holes between the source and drain.

For many applications, it is desirable to use polysilicon semiconductor material for the gate.

Electrical contact to the source and drain is made by forming a hole through the overlying passivation layer down to the principal surface of the substrate to expose a portion of the source and drain. Conductive metal is deposited in the hole over the source or drain to provide electrical contact thereto.

Depending upon how closely one can align the contact hole to a desired location, usually within 2 or 3 microns, it is desirable to leave a spaced separation of 4 to 5 microns between an edge of the polysilicon gate and an edge of the source or drain contact hole. This separation helps to ensure that the contact hole does not overlap the gate, which would cause an electrical short to occur between the gate and metal in the source or drain contact hole.

With the increasing trend in the semiconductor field toward the development of large-scale integration devices and semiconductor memories, in which many active elements are fabricated close together on a single piece of semiconductor material, often referred to as "chip," it is desirable to fabricate as many elements as possible on the chip.

The amount of surface area of a chip needed per active element often determines how many elements can be made in the chip. Thus, it is desirable to reduce the amount of surface area needed per active element. With such high-density devices, the requirement of allowing a space of 4 to 5 microns between the gate and the source and drain contact holes of an IGFET device means that the potential density of a device is substantially reduced. Thus, there is a need to reduce the separation between the gate and source or drain contact hole while preventing electrical shorts between the gate and the metal located in the source or drain contact hole.

BRIEF DESCRIPTION OF THE INVENTION

The structure and process of the invention overcomes the disadvantage of prior-art IGFET device structures in that the need for a separation of four to five microns between a contact hole to the source or drain and the polysilicon gate is eliminated. Briefly, a thin layer of oxide passivation material is located along an edge of the polysilicon gate adjacent to the contact hole, and provides electrical isolation between the gate and metal in the source or drain contact hole.

One structure comprises a substrate of semiconductor material of one conductivity type having a principal surface. Located within the semiconductor substrate are a plurality of spaced regions of opposite conductivity type, each region forming a PN junction with the substrate, and each junction extending to have an edge at the principal surface. A first layer of silicon dioxide passivation material is located over at least a portion of the principal surface including the surface edge of each of the PN junctions. A second layer of silicon nitride dielectric material is located over at least a portion of the first layer. A third layer of polysilicon semiconductor material is located over a portion of the second layer. A fourth layer of phosphorous vapox material is located over portions of the second and third layers. A hole extends through the fourth, second, and first layers to expose a portion of the principal surface over a region of opposite conductivity type. A fifth layer of oxide passivation material is located at least along an edge of the third layer adjacent to the contact hole to provide electrical isolation between the third layer and metal in the contact hole. Alternative structures of the invention are described below.

One method of the invention comprises forming a substrate of semiconductor material of one conductivity type having a principal surface. A first layer comprising silicon dioxide passivation material is grown over a portion of the principal surface. A second layer of silicon nitride dielectric material is deposited over a portion of the first layer. A third layer of polysilicon material is formed in a desired pattern over a portion of the second layer. Next, spaced regions of opposite conductivity type are created in the substrate, by ion implantation and diffusion, each region forming a PN junction with the substrate, with an edge of each junction extending to the principal surface under the first layer of oxide. A fourth layer of phosphorous vapox is formed over the third layer and exposed portions of the second layer. Contact holes are etched through the fourth layer down to the second and third layers. A fifth layer of oxide passivation material is grown preferentially over the exposed portions of the third layer, since negligible oxidation occurs on exposed portions of the second layer. Selected portions of the first and second layers are then removed to form a hole that extends through the first and second layers to expose a portion of principal surface overlying a region of opposite conductivity type. Conductive metal is deposited in the hole and provides electrical contact to the underlying region. Alternative methods of the invention are described below.

BRIEF DESCRIPTION OF THE DRAWINGS

FIGS. 1 through 12 are simplified cross-sectional views of one structure of the invention during various steps of fabrication wherein a thin layer of silicon dioxide passivation material is located along an edge of the polysilicon gate adjacent to the contact hole.

DESCRIPTION OF THE PREFERRED EMBODIMENTS

Figure 13:
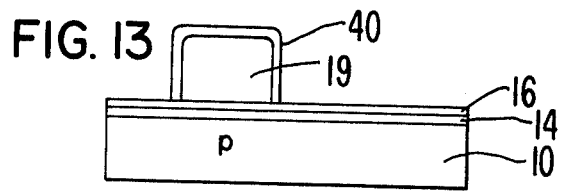
FIGS. 13 through 19 are simplified cross-sectional views of an alternative structure of the invention during various steps of fabrication wherein silicon dioxide passivation layer overlies the polysilicon gate.

Referring to FIG. 1, the method of forming the IGFET device structure of the invention comprises selecting a substrate 10 of semiconductor material having a principal surface 11. Typically, impurities comprising atoms of one conductivity type, such as P type, are incorporated into a wafer of semiconductor material, such as silicon, to form the substrate. Typically, impurity concentration in the substrate is sufficient to provide a bulk resistivity of about five to twenty ohm-centimeters. Substrate thickness is typically about 500 microns.

Referring to FIG. 2, a layer 14 of passivation material, such a silicon dioxide and approximately 500 to 1,000 Angstroms thick, is formed over the principal surface 11 by well-known thermal growth techniques at a relatively high temperature, such as from 900° C to 1,000° C. Oxide layer 14 protects surface 11 from contamination that could effect the electrical characteristics of PN junctions that are later formed in the substrate 10.

Referring to FIG. 3, a layer 16 of oxidation resistant dielectric material, such as silicon nitride about three hundred and fifty Angstroms thick, is formed over the oxide layer 14, suitably by well-known deposition techniques wherein the environmental temperature approaches 700° C to 1,000° C.

Referring to FIG. 4, a layer 18 of polysilicon material about 5,000 to 7,000 Angstroms thick is formed over dielectric layer 16, and functions as a gate in an IGFET device. Impurities comprising dopant atoms of N type conductivity are located throughout polysilicon layer 18 to provide desired electrical conductivity characteristics. Typically, the impurity concentration in polysilicon layer 18 is greater than $10^{20}$ dopant atoms per cubic centimeter.

Referring to FIG. 5, well-known photo masking and etching techniques are used to remove a portion of layer 18 while leaving other portions and thereby define a pattern of polysilicon 19 over dielectric layer 16. The above-mentioned process steps as illustrated in FIGS. 1 through 5 comprise the preliminary steps of forming the structure of the invention as well as alternative structures.

Referring to FIG. 6, well-known ion implantation techniques are used to form spaced regions of opposite conductivity type, such as regions 20 and 22, in substrate 10. Such regions are referred to as source and drain in IGFET technology. Ion implantation comprises use of a scanner that aims a beam of selected ions with high energy at the principal surface, which penetrate through oxide layer 14 and dielectric layer 16 and into the semiconductor substrate 10. The ions become embedded into substrate 10, where they form source and drain regions 20 and 22 that extend to a depth of a few thousand Angstroms. The polysilicon gate 19 absorbes some of the ions and prevents them from reaching that portion of the principal surface under gate 19. Suitably, the ions have a conductivity type that is opposite to that of substrate 10, such as N type when substrate 10 is P type. Between the two areas of opposite conductivity type are formed PN junctions, such as PN junctions 21 and 23, that extend to have an edge, such as respective edges 24 and 25, at the principal surface 11. The area 26 between source and drain 20 and 22 is referred to in IGFET device technology as a channel and provides a path through which electrons, or holes, move between the source and drain 20 and 22. Application of voltage potentials to polysilicon gate 19 overlying channel 26 provides control of electron flow in channel 26.

Referring to FIG. 7, a layer 30 of phosphorous vapox material about 0.5 to 1.5 microns thick is formed over exposed portions of the dielectric layer 16 and polysilicon gate 19. In order to change the relatively sharp edges of phosphorous vapox layer 30, heat is applied at a temperature of about 1,000° C to 1,100° C for approximately thirty minutes, which causes layer 30 to densify and reflow into a relatively smooth, well-rounded configuration 31, as shown in FIG. 8.

Referring to FIG. 9, well-known masking and etching techniques are used to create a hole 33 through phosphorous vapox layer 31 down to dielectric layer 16. Note that in creating the hole 33, one causes a portion of polysilicon gate 19 to be exposed. Because polysilicon gate 19 is electrically conductive, it is necessary to ensure electrical isolation from hole 33 where conductive metal is deposited during a later step for electrical contact to the underlying source or drain region 22.

Referring to FIG. 10, a layer 40 of passivation material, such as silicon dioxide, about 5,000 Angstroms thick, if formed, suitably by thermal growth techniques, preferentially over the exposed portion of polysilicon gate 19, particularly the edge of gate 19 adjacent to the hole 33, since exposed portions of layer 16 have a negligible oxidation rate.

Referring to FIG. 11, well-known photo masking and etching techniques are used to extend hole 33 to principal surface 11 by removing a portion of dielectric layer 16 and oxide layer 14 within the hole and directly over source or drain region 22. Because the oxide layer 14 and dielectric layer 16 are much thinner than upper oxide layer 40, the etching solution will remove sufficient portions of layers 14 and 16 to expose fully a portion of principal surface 11 over active region 22 before enough of oxide layer 40 is removed to diminish the ability of layer 40 to electrically isolate gate 19 from the metal subsequently deposited into contact hole 33.

Referring to FIG. 12, conductive metal 35 such as aluminum is deposited into hole 33 over source or drain 22 to provide electrical contact thereto. Because oxide layer 40 is located between gate 19 and metal contact 35 in hole 33, no electrical short therebetween can occur. Oxide layer 40 eliminates the need to provide a separation of from 4 to 5 microns between polysilicon gate 19 and contact hole 33, while still providing protection from electrical shorts. The separation between the side of hole 33 and an edge of gate 19 is now less than five tenths of a micron, which saves surface space by an order of magnitude over that needed by prior-art IGFET devices.

For example, if one contact hole is made to the source and another is made to the drain and each hole is about 5 microns wide, and if the gate is about 6 microns wide, the total width required for the two contact holes and gate is about 16 microns. by contrast, prior-art IGFET devices needed a separation of about five microns between each contact hole and the gate. The smallest width acceptable with a prior-art IGFET device, which requires a separation of about 5 microns between each contact hole and the gate, is 26 microns, which is 10 microns more than that of the IGFET device of the invention. Thus, assuming contact holes for both the source and drain, the structure of the invention uses only about 60 percent of the surface area required by a prior-art IGFET device. In other words, using the structure of the invention for IGFET devices in which contact holes are made to both the source and drain, one can potentially fabricate up to almost 40 percent more IGFET devices for a given surface area compared to prior-art IGFET device structures.

A first of several alternative methods of forming the structure of the invention commences after the preliminary steps described above and illustrated FIGS. 1 through 5 are performed. The steps in this alternative method are illustrated in FIGS. 13 through 19. Referring to FIG. 13, a layer 40 of oxide passivation material about 0.5 micron thick is thermally grown over the polysilicon gate 19. A very thin layer (not shown in FIG. 13) about 30 to 50 Angstroms thick is also grown over oxidation-resistant layer 16 at this step.

Figure 14:
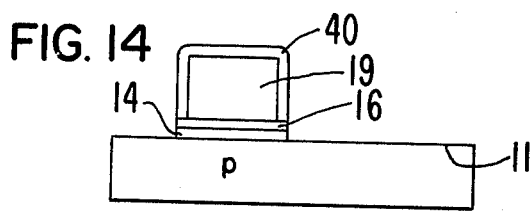

Referring to FIG. 14, well-known photo masking and etching techniques are used to remove the thin upper oxide layer (not shown) from dielectric layer 16 and to remove portions of dielectric layer 16 and oxide layer 14 not underlying gate 19 from the principal surface 11.

Figure 15:
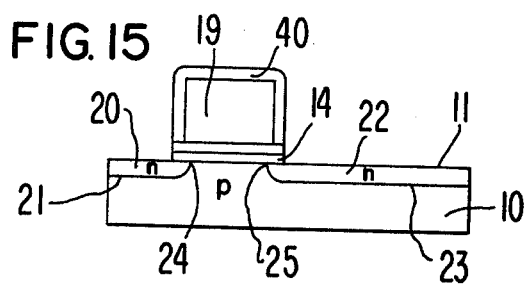

Referring to FIG. 15, impurities comprising dopant atoms of opposite conductivity type from that of the substrate 10, for example, of N type conductivity, are diffused into substrate 10 from surface 11, which form spaced source and drain regions 20 and 22. The PN junctions 21 and 23 between regions 20 and 22 each extend to have respective edges 24 and 25 at principal surface 11 under oxide passivation layer 14.

Figure 16:
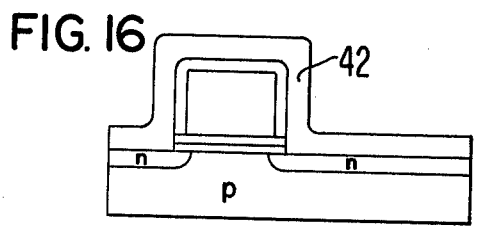
Figure 17:
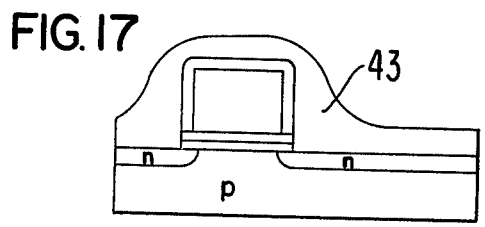

Referring to FIG. 16, a layer 42 of phosphorous vapox material about 0.5 to 1.5 microns thick is grown over the exposed portion of surface 11 and upper oxide layer 40. In order to smooth out unwanted sharp corners in layer 42, heat is applied at approximately 1,000° C to 1,100° C for approximately 30 minutes, which cause phosphorous vapox layer 42 to densify, reflow, and assume a smooth rounded shape 43 as shown in FIG. 17.

Figure 18:
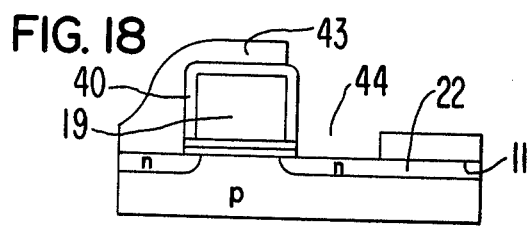

Referring to FIG. 18, well-known photo masking and etching techniques are used to remove a portion of phosphorous vapox layer 43 and form contact hole 44 that extends to a portion of principal surface 11 over source or drain region 22. Note that after contact hole 44 is formed, oxide layer 40 continues to overlie the sides and top of polysilicon gate 19, particularly along the edge adjacent to hole 44, since layer 40 etches much more slowly than layer 43 in buffered hydrofluoric acid, a typical solution for etching oxides.

Figure 19:
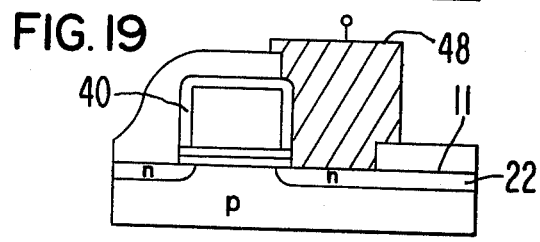

Referring to FIG. 19, a layer 48 of conductive metal is deposited into contact hole 44 and onto exposed surface 11 overlying source or drain region 22 to provide electrical contact thereto. Oxide layer 40 prevents possible shorts from occurring between gate 40 and metal contact 48.

A second of several alternative methods of forming the structure of the invention again comprises preliminary steps similar to those for the above-described structures and illustrated in FIGS. 1 through 5. The next two steps are similar to that of the above-described first alternative method and illustrated in FIGS. 13 and 14. The new steps are shown in FIGS. 20 through 24.

Figure 20:
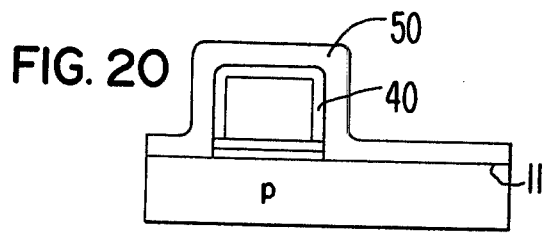
FIGS. 20 through 24 are simplified cross-sectional views depicting alternative steps of forming the alternative structure of FIG. 19.

Referring to FIG. 20, the next step for the second alternative method comprises forming a layer 50 of phosphorous vapox about 0.5 to 1.5 microns thick over the exposed principal surface 11 and oxide layer 40.

Figure 21:
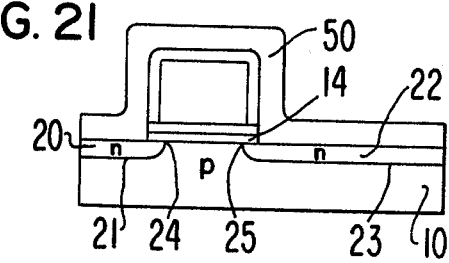
Figure 22:
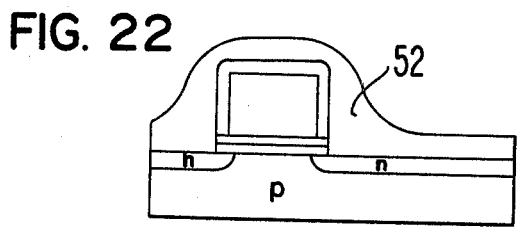

Referring to FIG. 21, the source and drain regions 20 and 22 are formed by applying heat to a temperature of about 1,000° C in a nitrogen ambient for about thirty minutes to cause phosphorous impurities in phosphorous vapox layer 50 to migrate by diffusion out of layer 50 and into the substrate 10. During this heat treatment, a desired amount of impurity diffusion has occurred and source and drain regions 20 and 22 of opposite conductivity type are formed along with PN junctions 21 and 23 that extend to have edges 24 and 25 at principal surface 11. A second heating step is performed at a temperature of about 1,000° C to 1,100° C in a dry oxygen ambient for about thirty minutes to enable phosphorous vapox layer 50 to reflow and assume a smoother, more rounded shape 52, as illustrated in FIG. 22.

Figure 23:
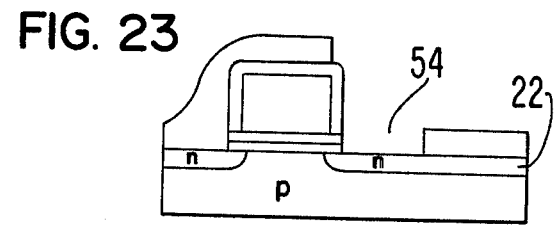

Referring to FIG. 23, well-known photo masking and etching techniques are used to remove a portion of phosphorous vapox layer 52 and form contact hole 54, leaving a substantial portion of the exposed slow etching layer 40 intact.

Figure 24:
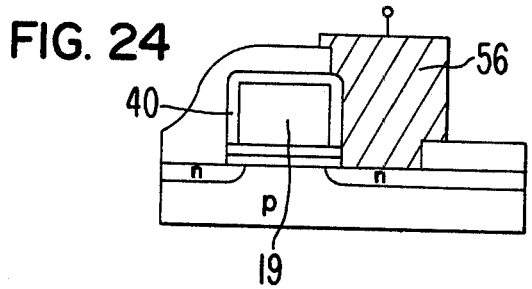

Referring to FIG. 24, a layer 56 of conductive metal is deposited into contact hole 54 and onto surface 11 overlying source or drain region 22 to provide electrical contact thereto. Note that upper oxide layer 40 provides electrical isolation between polysilicon gate 19 and metal contact 56.

A third of several alternative methods of forming the basic structure of the invention also comprises preliminary steps similar to that of the first six steps of the first structure described above and illustrated in FIGS. 1 through 6. The remaining steps are shown in FIGS. 25 through 30.

Figure 25:
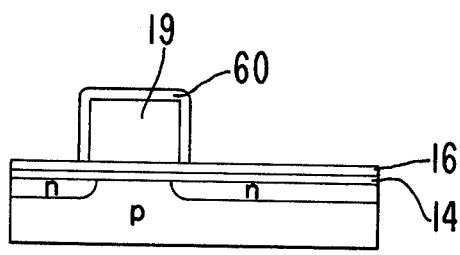
FIGS. 25 through 30 are simplified cross-sectional views depicting a second set of alternative steps of forming the alternative structure of FIG. 19.

Referring to FIG. 25, a layer 60 of oxide passivation material is thermally grown over the polysilicon gate 19.

Figure 26:
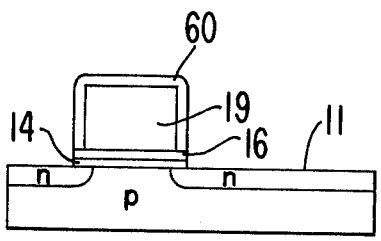

Referring to FIG. 26, well-known photo masking and etching techniques are used to remove portions of dielectric layer 16 and oxide layer 14, while leaving other portions of layers 14 and 16 underlying gate 19 intact.

Figure 27:
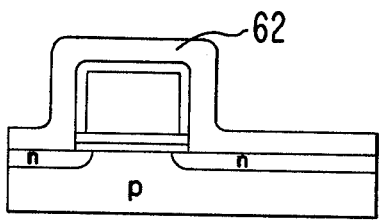
Figure 28:
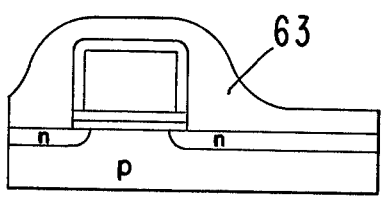

Referring to FIG. 27, a layer 62 of phosphorous vapox material about 0.5 to 1.5 microns thick is deposited over upper oxide layer 60 and exposed portions of principal surface 11. Heat is applied to cause the phosphorous vapox layer 62 to densify and reflow, and assume a smoother, rounded shape 63 as shown in FIG. 28.

Figure 29:
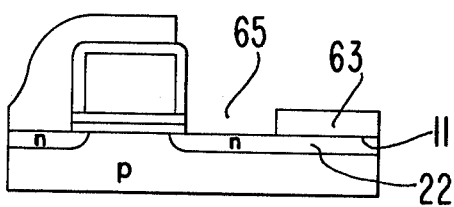

Referring to FIG. 29, well-known photo masking and etching techniques are next used to remove a portion of phosphorous vapox layer 63 to form contact hole 65 that extends to a portion of principal surface 11 overlying source or drain region 22, while leaving a substantial portion of the exposed slow etching layer 60 intact.

Figure 30:
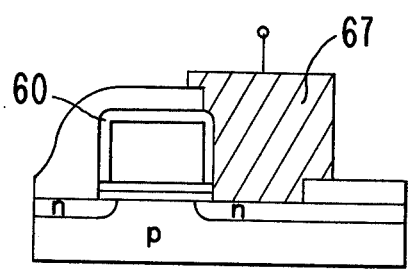

Referring to FIG. 30, a layer 67 of conductive metal is deposited into contact hole 65 and onto a portion of surface 11 to provide electrical contact to active region 22. As with previously described structures, upper oxide layer 60 provides electrical isolation between polysilicon gate 19 and metal source or drain contact 67.

I claim:

1. Method comprising:

forming a substrate of semiconductor material of one conductivity type, the substrate having a principal surface;

growing a first layer comprising oxide passivation material over a portion of the principal surface;

depositing a second layer comprising nitride dielectric material over a portion of the first layer;

forming a third layer comprising polysilicon material in a desired pattern over a portion of the second layer;

forming a plurality of spaced regions of opposite conductivity type, each region forming a PN junction with the substrate, with an edge of each junction extending to the principal surface under the first layer of oxide;

forming a fourth layer comprising phosphorous vapox over the third layer and exposed portions of the second layer;

removing a selected portion of the fourth layer to create a hole therethrough that extends to the second layer and abuts said third layer;

growing a fifth layer comprising oxide passivation material over exposed portion of the third layer;

removing selected portions of the first and second layers to extend the hole therethrough to the principal surface overlying a region of opposite conductivity type, and depositing conductive metal into the hole and onto the principal surface to provide electrical contact to the underlying region of opposite conductivity whereby said fifth layer provides electrical insulation between said conductive metal and said third layer.

2. Method of claim 1 wherein the step of forming the first layer comprises thermally growing the oxide at a relatively high temperature.

3. Method of claim 1 wherein the step of forming the third layer comprises the substeps of depositing polysilicon over the second layer, and removing selected portions of the polysilicon while leaving other portions of polysilicon on the second layer in a desired pattern.

4. Method of claim 1 wherein the step of forming the spaced regions of opposite conductivity type comprises ion implantation.

5. Method of claim 1 wherein the step of forming the fourth layer comprises the substeps of depositing phosphorous vapox over the third layer and exposed portions of the second layer, and applying heat at a relatively high temperature for a sufficient time period to cause the phosphorous vapox to densify and reflow.

6. Method of claim 1 wherein the phosphorous vapox comprises vapor oxide with phosphorous atoms located therein and comprising 5 to 10 percent by weight of the vapox, the semiconductor material comprises silicon, the oxide layers comprise silicon dioxide, and the nitride layer comprises silicon nitride.

* * * * *